US 12,111,611 B2

(12) United States Patent
Tashiro (10) Patent No.: US 12,111,611 B2
(45) Date of Patent: Oct. 8, 2024

(54) DUCT UNIT AND IMAGE FORMING APPARATUS

(71) Applicant: CANON KABUSHIKI KAISHA, Tokyo (JP)

(72) Inventor: Yuki Tashiro, Chiba (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 18/190,258

(22) Filed: Mar. 27, 2023

(65) Prior Publication Data

US 2023/0315012 A1    Oct. 5, 2023

(30) Foreign Application Priority Data

Mar. 30, 2022 (JP) ................................. 2022-056437

(51) Int. Cl.
| | |
|---|---|
| *G03G 21/00* | (2006.01) |
| *F24F 7/00* | (2021.01) |
| *F24F 7/06* | (2006.01) |
| *G03G 21/20* | (2006.01) |
| *H05K 7/00* | (2006.01) |
| *H05K 7/20* | (2006.01) |

(52) U.S. Cl.
CPC ............ *G03G 21/206* (2013.01); *F24F 7/065* (2013.01); *H05K 7/20172* (2013.01); *G03G 2221/1645* (2013.01)

(58) Field of Classification Search
CPC ........... G03G 21/206; G03G 2221/1645; B41J 29/377; F24F 7/065; H05K 7/20145; H05K 7/20172

USPC ........................................................ 399/92
See application file for complete search history.

(56) References Cited

U.S. PATENT DOCUMENTS

| | | | |
|---|---|---|---|
| 7,024,129 B2 * | 4/2006 | Adachi .............. | H04N 1/00909 399/92 |
| 2006/0237165 A1 * | 10/2006 | Mizuguchi ............... | B41J 29/10 165/59 |
| 2015/0139793 A1 * | 5/2015 | Tanaka ................ | F04D 25/0613 415/213.1 |
| 2015/0217954 A1 * | 8/2015 | Fujikura ............ | G03G 15/6502 271/90 |
| 2016/0004216 A1 * | 1/2016 | Hatanaka ............. | G03G 21/206 399/92 |
| 2019/0324388 A1 * | 10/2019 | Naruse ................. | G03G 15/161 |
| 2020/0019102 A1 * | 1/2020 | Noguchi ............ | G03G 15/5016 |

FOREIGN PATENT DOCUMENTS

| | | | | |
|---|---|---|---|---|
| EP | 1294219 A2 * | 3/2003 | ......... | H05K 7/20172 |
| JP | 2007148102 A * | 6/2007 | | |
| JP | 2015127744 A | 7/2015 | | |

* cited by examiner

*Primary Examiner* — Robert B Beatty
(74) *Attorney, Agent, or Firm* — ROSSI, KIMMS & McDOWELL LLP (57) ABSTRACT

A duct unit is disposed inside a housing of an image forming apparatus and used. The duct unit includes an airflow generation unit, a duct, and a first holding portion and a second holding portion. The duct has a shape in which a center of an intake port and a center of an exhaust port are shifted from each other. The first holding portion and the second holding portion are provided at different positions with respect to the duct so as to be able to hold the duct unit with respect to the housing in a first posture and a second posture.

15 Claims, 9 Drawing Sheets

A-A CROSS SECTION

DUCT UNIT AND IMAGE FORMING APPARATUS

BACKGROUND OF THE INVENTION

Field of the Invention

The present invention relates to a duct unit disposed inside a housing of an image forming apparatus and used, and an image forming apparatus including the duct unit.

Description of the Related Art

In the image forming apparatus, various units such as a laser scanner unit, a process cartridge for transferring a toner image to a recording material, a driving unit for moving the laser scanner unit and the process cartridge, and a fixing unit for fixing an image to the recording material are present inside the housing. When an image is formed by these units, if the temperature inside the housing rises, the quality of the image to be formed may be deteriorated due to heat dissolution of the toner or the like.

JP 2015-127744 A discloses that when there are a plurality of cooling targets such as a fixing unit, a member in a housing is efficiently cooled in a space in which arrangement of a fan is limited by providing two opening portions for one duct.

For example, in an image forming apparatus (commercial printing machine) intended for commercial printing, there are a plurality of driving units and heat generating elements that have high power consumption and generate high heat in proximity to the back surface side of the housing in order to realize high productivity as compared with a general printing machine. In the configuration described in JP 2015-127744 A, it is possible to efficiently perform the exhaust heat with respect to the heat sources at two locations in the vicinity in a space-saving manner. However, in the case of the configuration described in JP 2015-127744 A, it is difficult to efficiently suck air to a plurality of heat sources in which members that cause heat retention such as substrates, support columns supporting the substrates, and support plates exist.

In addition, in a case where a duct that takes in air and exhausts heat at two locations for each heat source while avoiding these members is assumed, the shape becomes complicated, the pressure loss in the air path of the duct is high, the efficiency of the fan is lowered, and as a result, there is a concern that the fan becomes huge and the maintainability is deteriorated.

SUMMARY OF THE INVENTION

The present invention provides a configuration that can be disposed in a space-saving manner and can efficiently suck air from the vicinity of a heat source.

According to a first aspect of the present invention, a duct unit disposed inside a housing of an image forming apparatus and used, the duct unit includes an airflow generation unit configured to generate an airflow, a duct through which the airflow generated by the airflow generation unit flows, and, a first holding portion and a second holding portion for holding the duct unit in the housing. The duct has a shape in which an intake port and an exhaust port are located on the same straight line with respect to an airflow direction in which the airflow flows, and a center of the intake port and a center of the exhaust port in a cross section orthogonal to the airflow direction are shifted from each other. The first holding portion and the second holding portion are provided at different positions with respect to the duct so as to be able to hold the duct unit with respect to the housing in a first posture and a second posture in which a direction in which the center of the intake port and the center of the exhaust port are shifted with respect to the housing is a direction different from a direction in which the center of the intake port and the center of the exhaust port are shifted with respect to the housing in the first posture.

According to a second aspect of the present invention, an image forming apparatus includes a housing having a plurality of heat sources therein, and, a plurality of duct units disposed inside the housing so as to correspond to the plurality of heat sources. Each of the plurality of duct units includes an airflow generation unit configured to generate an airflow, a duct through which the airflow generated by the airflow generation unit flows, and, a first holding portion and a second holding portion for holding the duct unit in the housing. The duct has a shape in which an intake port and an exhaust port are located on the same straight line with respect to an airflow direction in which the airflow flows, and a center of the intake port and a center of the exhaust port in a cross section orthogonal to the airflow direction are shifted from each other. The first holding portion and the second holding portion are provided at different positions with respect to the duct so as to be able to hold the duct unit with respect to the housing in a first posture and a second posture in which a direction in which the center of the intake port and the center of the exhaust port are shifted with respect to the housing is a direction different from a direction in which the center of the intake port and the center of the exhaust port are shifted with respect to the housing in the first posture. At least one of the plurality of duct units is held in the housing in the first posture. At least one of the plurality of remaining duct units is held in the housing in the second posture.

Further features of the present invention will become apparent from the following description of exemplary embodiments with reference to the attached drawings.

DESCRIPTION OF THE EMBODIMENTS

First Embodiment

Figure 1:
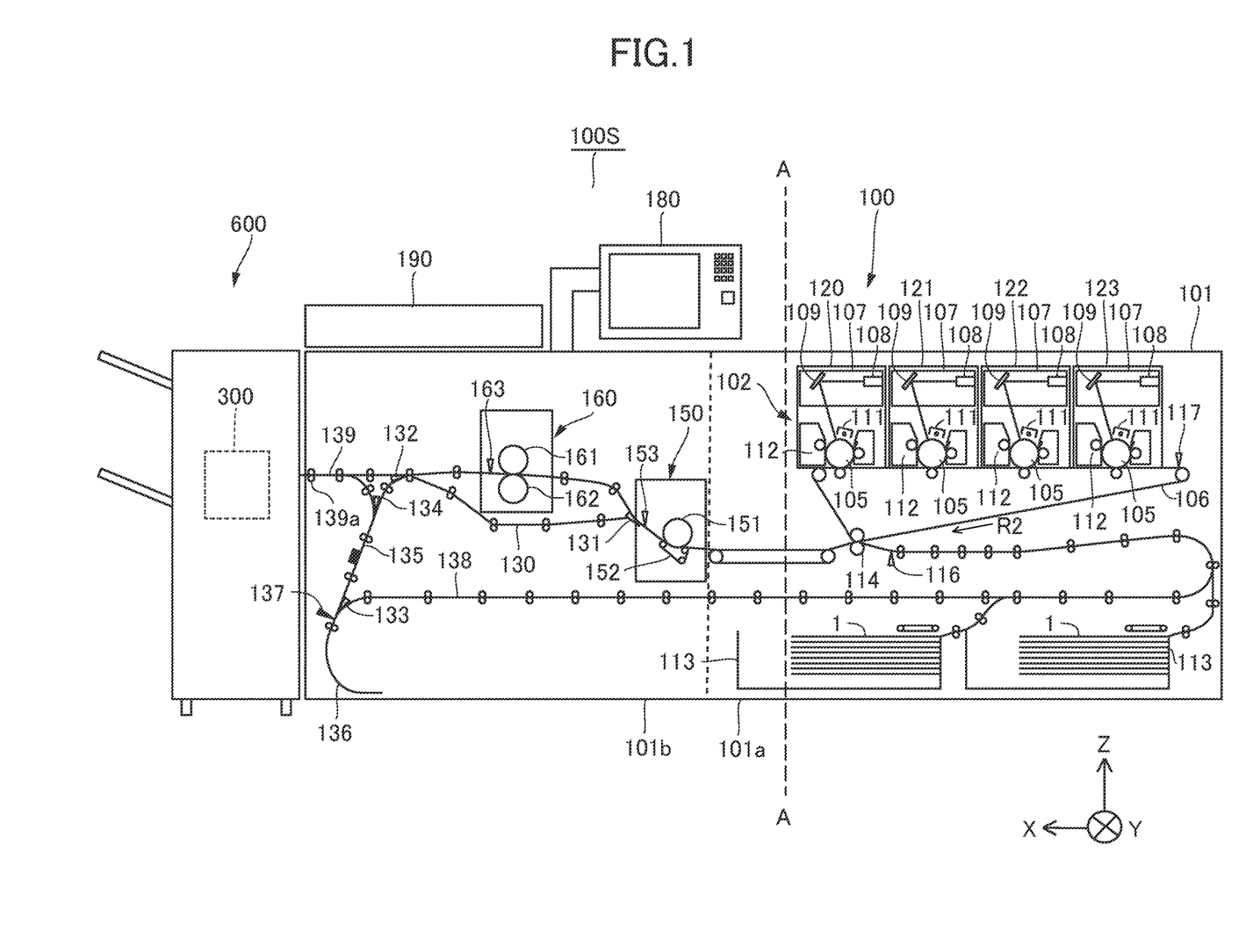
FIG. 1 is a schematic cross-sectional view of a configuration of an image forming system according to a first embodiment.

A first embodiment will be described with reference to FIGS. 1 to 8. First, an image forming system 100S of the present embodiment will be described with reference to FIG. 1. Image Forming System FIG. 1 is a schematic diagram illustrating an image forming system 100S according to the present embodiment. The image forming system 100S includes an image forming apparatus 100 and a finisher 600 as a sheet processing apparatus. The housing 101 of the image forming apparatus 100 includes a first housing 101a and a second housing 101b, and the first housing 101a is provided with an image forming unit 102, an intermediate transfer belt 106 to be described below, a storage 113, and the like. On the other hand, the second housing 101b is provided with a first fixing device 150, a second fixing device 160, a reverse conveyance path 135, and the like, which will be described below.

The image forming unit 102 includes stations 120, 121, 122, and 123 that form toner images of respective colors of yellow, magenta, cyan, and black, and an intermediate transfer belt 106. In each of stations 120 to 123, a primary charger 111 charges the surface of the photosensitive drum 105, which is a drum-shaped photosensitive member. The laser scanner unit 107 performs exposure processing of the photosensitive drum 105 on the basis of a command signal generated on the basis of image data and transmitted to the laser scanner unit 107. The laser scanner unit 107 includes a laser driver that drives laser light emitted from a semiconductor laser (not illustrated) to be turned on and off, and guides the laser light from the semiconductor laser to the photosensitive drum 105 via a reflecting mirror 109 while distributing the laser light in a main scanning direction by a rotating polygon mirror. As a result, an electrostatic latent image corresponding to the image data is formed on the surface of the photosensitive drum 105.

A developing device 112 accommodates developer containing toner therein, and supplies charged toner particles to the photosensitive drum 105. The toner particles adhere to the surface of the drum according to the surface potential distribution, whereby the electrostatic latent image born on the photosensitive drum 105 is visualized as a toner image. The toner image born on the photosensitive drum 105 is transferred (primarily transferred) to the intermediate transfer belt 106 to which a voltage having a polarity opposite to the normal charge polarity of the toner is applied. In the case of forming a color image, toner images formed by the four stations 120 to 123 are multiple-transferred so as to overlap each other on the intermediate transfer belt 106, whereby a full-color toner image is formed on the belt.

On the other hand, the feeding processing mechanism feeds sheets 1 one by one from the storage 113 inserted into the housing 101 of the image forming apparatus 100 in a drawable manner toward a transfer roller 114. The toner image born on the intermediate transfer belt 106 which is an intermediate transfer member is transferred (secondarily transferred) to the sheet 1 by the transfer roller 114.

Around the intermediate transfer belt 106, an image formation start position detection sensor 115 for determining a print start position when an image is formed, a feeding timing sensor 116 for setting a feeding timing of the sheet 1, and a density sensor 117 are disposed. The density sensor 117 measures the density of the patch image born on the intermediate transfer belt 106. A printer controller adjusts operation conditions (for example, the charging target potential of the primary charger 111 and the bias voltage of the developing device 112 are set) of the image forming unit 102 based on the detection result of the density sensor 117.

The fixing processing mechanism of the present embodiment includes a first fixing device 150 and a second fixing device 160. The first fixing device 150 includes a fixing roller 151 for applying heat to the sheet 1, a pressure belt 152 for pressing the sheet 1 against the fixing roller 151, and a first post-fixing sensor 153 for detecting completion of fixing processing by the first fixing device 150. Each of the rollers including the fixing roller 151 is a hollow roller, and has a heater therein. The first fixing device 150 applies heat and pressure to the toner image on the sheet while nipping and conveying the sheet 1 between the fixing roller 151 and the pressure belt 152 which are a pair of rotary members. As a result, the toner particles are melted and then fixed, whereby the toner image is fixed on the sheet 1.

The second fixing device 160 is disposed downstream of the first fixing device 150 in the conveyance path of the sheet 1. The second fixing device 160 has a function of enhancing glossiness of an image subjected to fixing processing by the first fixing device 150 and securing fixability of the image to the sheet 1. Similarly to the first fixing device 150, the second fixing device 160 includes a fixing roller 161 and a pressure roller 162 as a pair of rotary members that heat and pressurize the sheet 1 while conveying the sheet 1, and a second post-fixing sensor 163 for detecting completion of fixing processing by the second fixing device 160.

Depending on the type of the sheet 1, it may not be necessary to pass the second fixing device 160. In such a case, the image forming apparatus 100 includes a bypass conveyance path 130 for discharging the sheet 1 without passing through the second fixing device 160 for the purpose of reducing the energy consumption. The sheet 1 sent from the first fixing device 150 is guided to either the second fixing device 160 or the bypass conveyance path 130 by a first switching flap 131.

The sheet 1 that has passed through the second fixing device 160 or the bypass conveyance path 130 is guided to either a discharge conveyance path 139 or the reverse conveyance path 135 by a second switching flap 132. The position of the sheet 1 loaded into the reverse conveyance path 135 is detected by the reverse sensor 137, and a leading edge and a trailing edge of the sheet 1 in the sheet conveyance direction are switched by the switchback operation performed by a reverse portion 136. In the case of double-sided printing, the sheet 1 on which an image is formed on a first surface of the sheet 1 is conveyed again toward the transfer roller 114 via a re-conveyance path 138 in a state where the leading and trailing edge of the sheet 1 are switched by the reverse portion 136, and an image is formed on a second surface of the sheet 1. The sheet 1 on which the image formation of the single-sided printing has been completed or the sheet 1 on which the image formation of the second surface in the double-sided printing has been completed is discharged to the outside of the image forming apparatus 100 by a discharge roller 139a (discharge portion) provided in the discharge conveyance path 139.

Between the reverse conveyance path 135 and the discharge conveyance path 139, a switching flap 134 capable of guiding the sheet 1 switched back by the reverse portion 136 toward the discharge conveyance path 139 is provided, and front and back surfaces of the sheet 1 when being discharged from the image forming apparatus can be selected. Note that an image reading apparatus 190 that reads image information from a document is installed above the image forming apparatus 100. The sheet discharged by the discharge roller 139a is sent to the finisher 600, and is stacked as a product on a tray of the finisher 600.

Airflow Configuration

Figure 2:
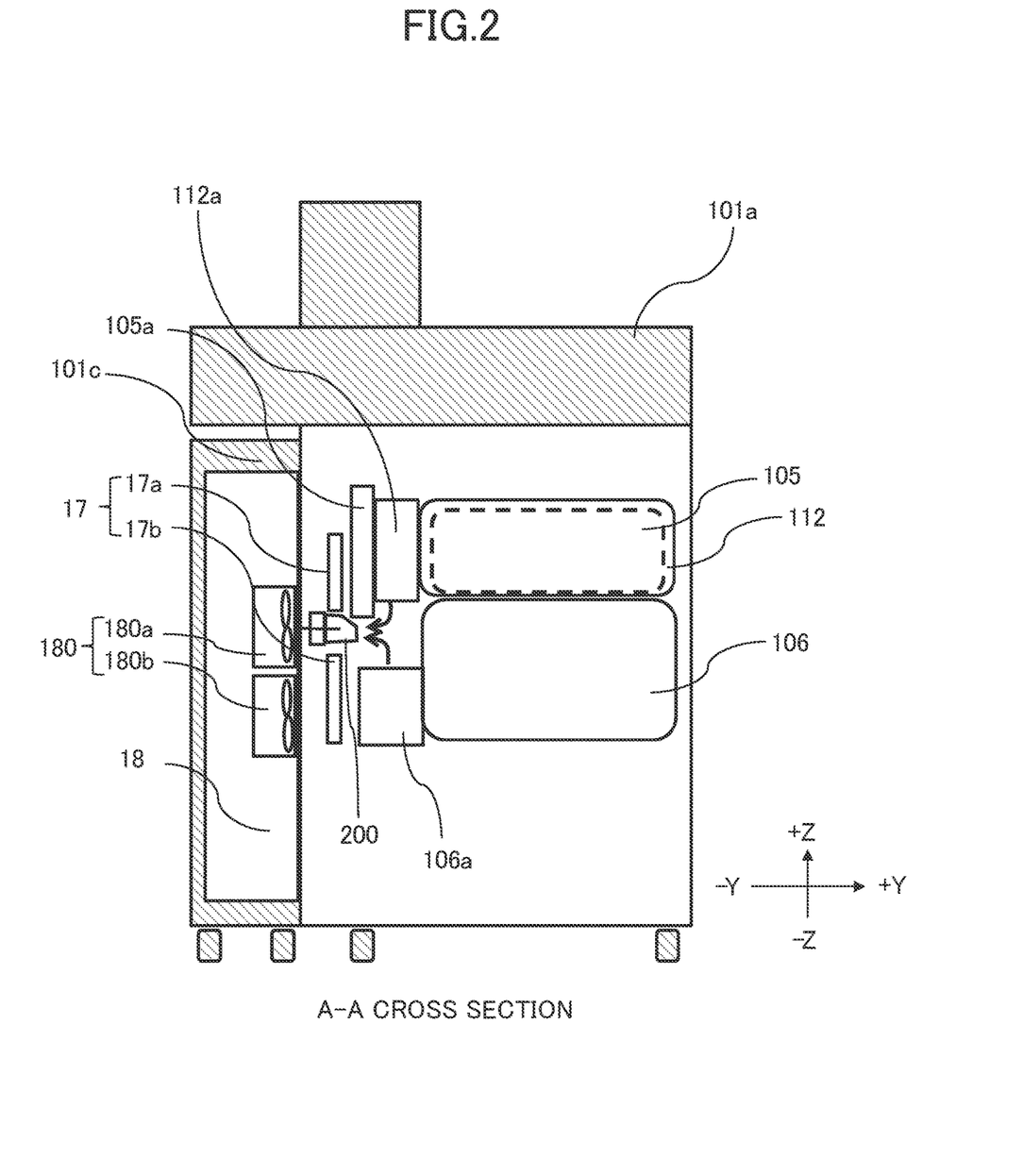
FIG. 2 is a schematic view corresponding to an A-A cross section of FIG. 1.

FIG. 2 is a cross-sectional view of the first housing 101a of the image forming apparatus 100. On the back surface of the image forming apparatus 100, as illustrated in FIG. 2, electric units 17 having a substrate, a bundle of wires electrically connecting the electric units 17, a drum driving unit 105a that operates the photosensitive drum 105, a development driving unit 112a that operates the developing device 112, and an intermediate transfer belt driving unit 106a that operates the intermediate transfer belt 106 are disposed.

In addition, a third housing 101c including a power supply unit 18 for supplying power to the image forming system 100S is disposed in a rear portion of the back surface of the main body of the image forming apparatus 100, and the first housing 101a and the third housing 101c are joined by fastening exteriors facing each other with screws. Inside the third housing 101c, a main body heat exhaust fan 180 that is an axial fan for performing the heat exhaust on the back side of the first housing 101a is provided.

The main body heat exhaust fan 180 is disposed in a central portion of the third housing 101c, and forms an airflow path having a cutout shape provided in exterior portions of the first housing 101a and the third housing 101c as an intake port and an exhaust port on a back surface of the third housing 101c.

However, it has been confirmed from the simulation that the development driving unit 112a and the intermediate transfer belt driving unit 106a as the heat source include a motor that generates heat of up to 90° C., and the generated heat is retained by the electric unit 17, the support column 170 and the support plate 171 (see FIGS. 6A and 6B) for supporting the electric unit 17, and the drum driving unit 105a, and the heat cannot be completely exhausted by the main body heat exhaust fan 180, and the image forming unit 102 is affected by the heat.

Exhaust Assist Unit

Figure 3A:
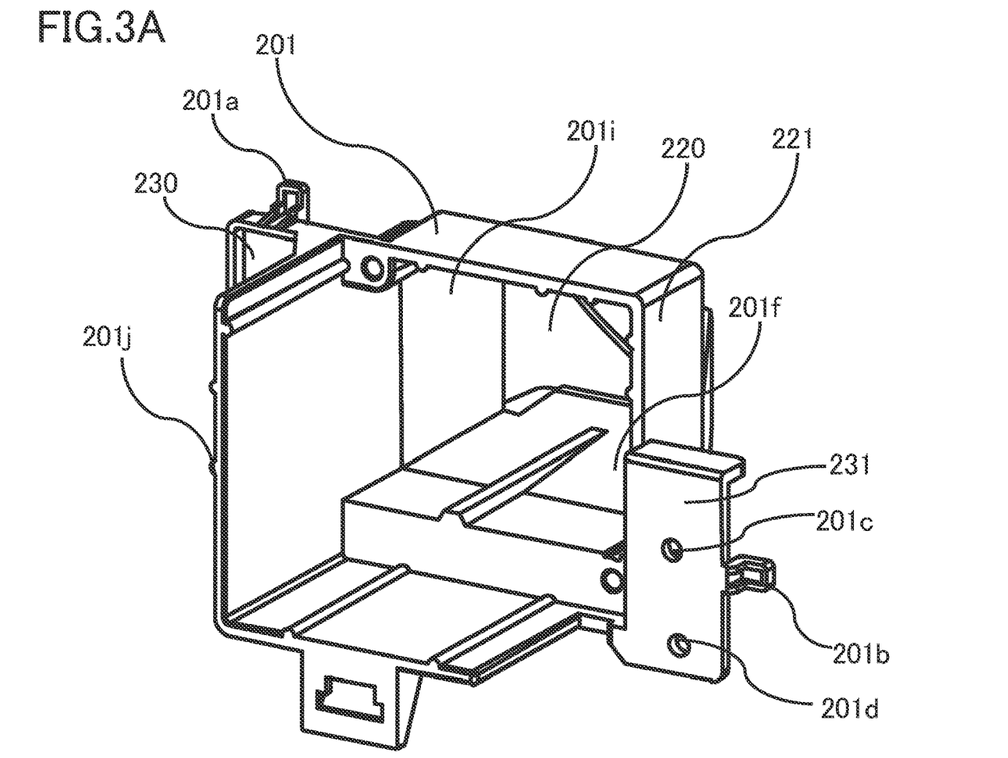
FIG. 3A is a perspective view illustrating an exhaust assist unit according to the first embodiment without an exhaust assist fan.
Figure 3B:
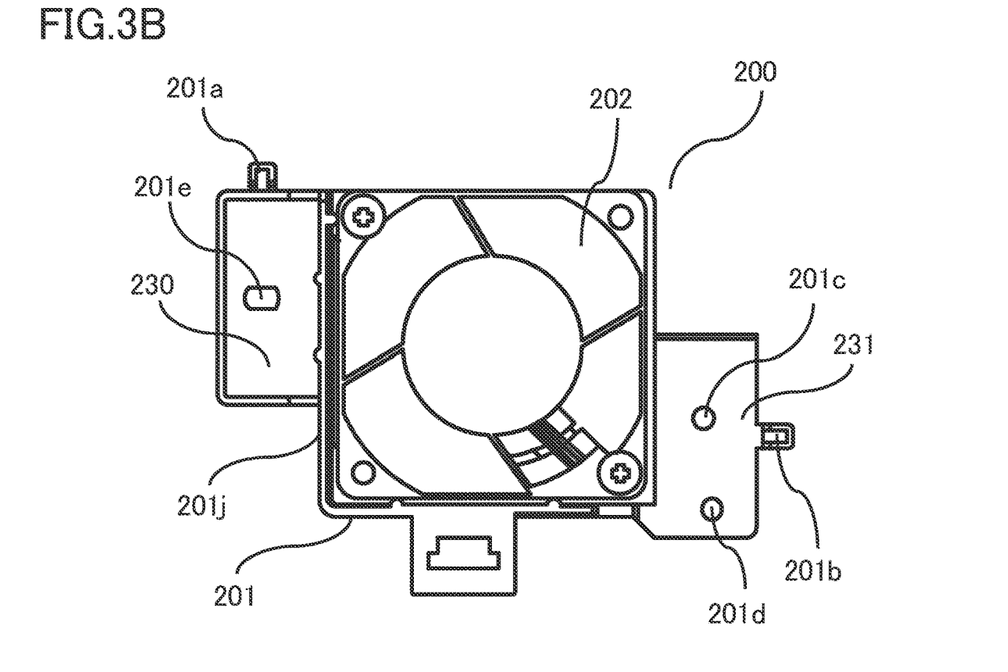
FIG. 3B is a view of the exhaust assist unit according to the first embodiment as viewed from a fan side.
Figure 4A:
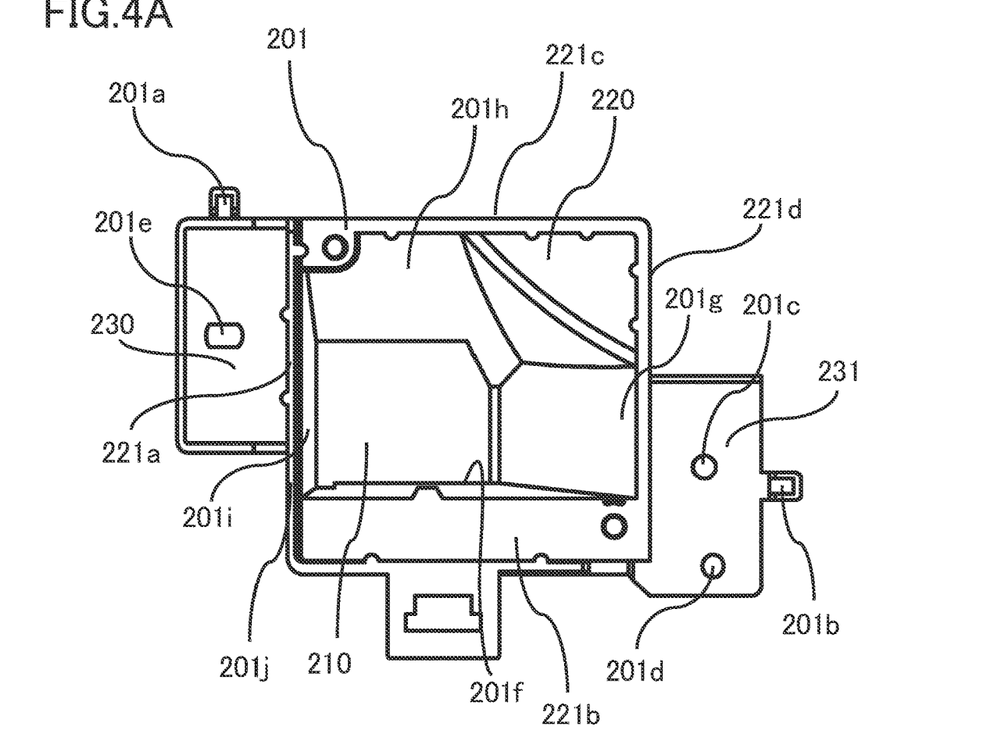
FIG. 4A is a view of the exhaust assist unit according to the first embodiment as viewed from an intake port side.
Figure 4B:
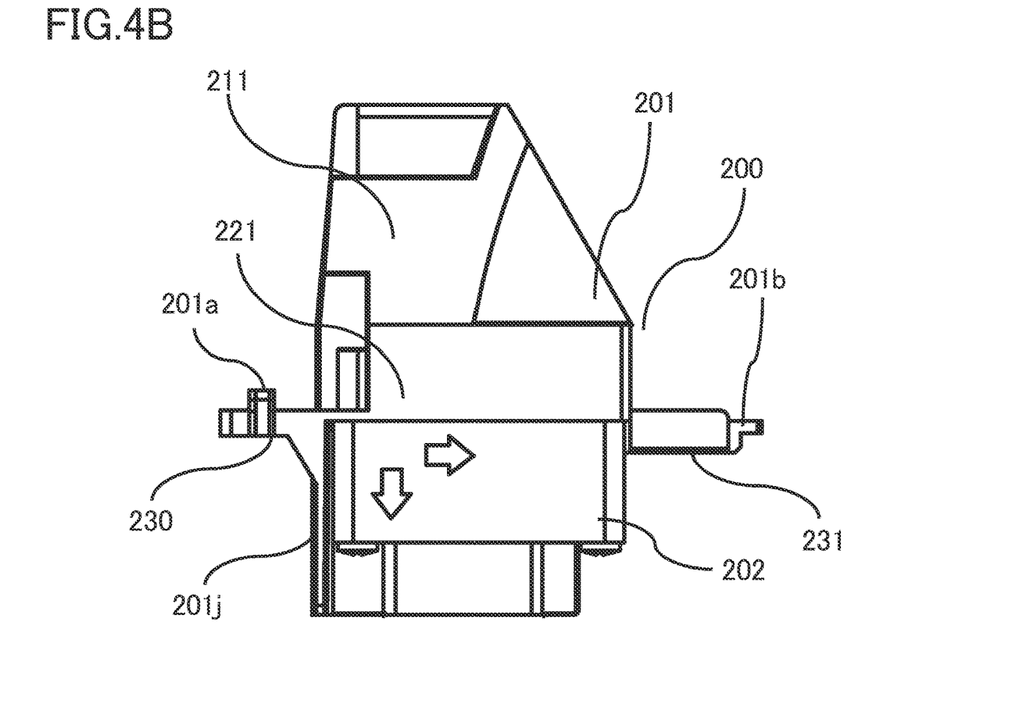
FIG. 4B is a view of the exhaust assist unit according to the first embodiment as viewed from above.
Figure 5:
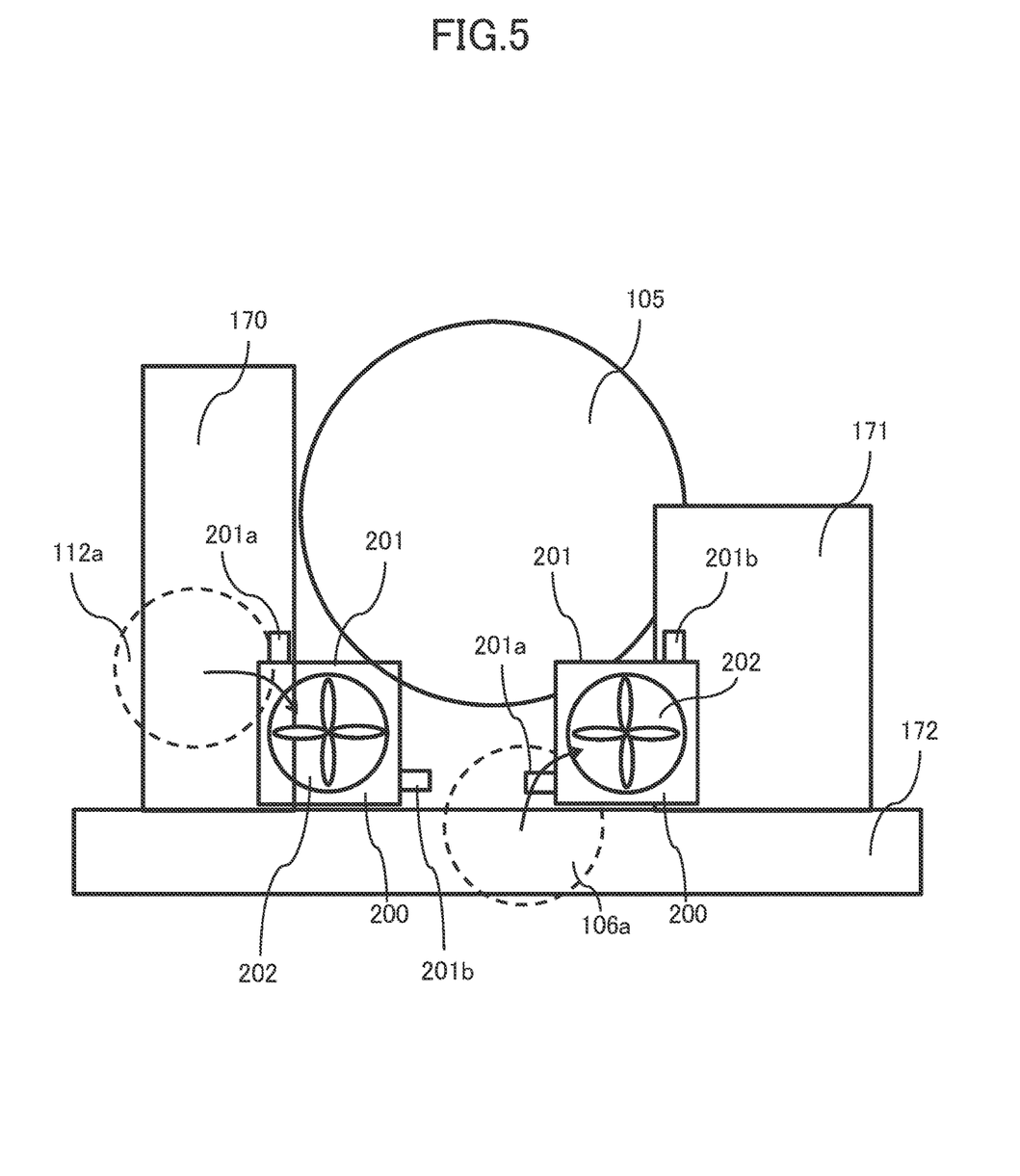
FIG. 5 is a schematic view for explaining a state in which the exhaust assist unit according to the first embodiment is assembled to a housing.

On the other hand, in the present embodiment, an exhaust assist unit 200 in which an exhaust assist fan 202 and an exhaust assist duct 201 are integrated as illustrated in FIGS. 3A to 4B is disposed in the vicinity of the development driving unit 112a and the intermediate transfer belt driving unit 106a as illustrated in FIG. 5. As a result, the heat generated by the driving is guided to the main body heat exhaust fan 180, and the influence of the heat on the image forming unit 102 can be suppressed.

The exhaust assist unit 200 as a duct unit includes the exhaust assist fan 202 as an airflow generation unit, the exhaust assist duct 201 as a duct, a first holding portion 201a and a second holding portion 201b, and a first fixing plate portion 230 and a second fixing plate portion 231, and is disposed and used inside the housing 101 of the image forming apparatus 100. The exhaust assist fan 202 is a fan that generates an airflow, and is an axial fan in the present embodiment. The exhaust assist fan 202 may be a sirocco fan.

The exhaust assist duct 201 is a duct through which an airflow generated by the exhaust assist fan 202 flows, and includes an intake port 210 and an exhaust port 220. The exhaust assist duct 201 includes a first portion 211 on the intake port 210 side and a second portion 221 on the exhaust port 220 side. In the second portion 221, the first holding portion 201a and the second holding portion 201b are provided via the first fixing plate portion 230 and the second fixing plate portion 231.

The first holding portion 201a and the second holding portion 201b are portions for holding the exhaust assist unit 200 in the housing 101, and temporarily hold the exhaust assist unit 200 with respect to a support column or a support plate of the housing 101 so as to position the exhaust assist unit 200 in a certain posture with respect to a certain position of the housing 101 as described below. The first fixing plate portion 230 and the second fixing plate portion 231 are portions for fixing the exhaust assist unit 200 in the housing 101 in a state where the exhaust assist unit 200 is held in a certain posture by the first holding portion 201a and the second holding portion 201b.

Such an exhaust assist duct 201 has a shape in which the intake port 210 and the exhaust port 220 are positioned in the same straight line in the airflow direction (vertical direction in FIG. 4B) in which the airflow flows, and the center of the intake port 210 and the center of the exhaust port 220 are shifted from each other in the cross section orthogonal to the airflow direction. In the present embodiment, for this purpose, a cross section orthogonal to the airflow direction of the exhaust assist duct 201 has a rectangular shape described as follows.

That is, an inner peripheral surface of the first portion 211, which is a part of the exhaust assist duct 201 in the airflow direction, includes four surfaces of a first surface 201i, a second surface 201f, a third surface 201h, and a fourth surface 201g. The first surface 201i and the second surface 201f are arranged in parallel with the first direction along the airflow direction and are continuously arranged so as to intersect each other. Specifically, the ends of the first surface 201i and the second surface 201f are continuous so as to be orthogonal to each other, and each extend in parallel with the airflow direction.

The third surface 201h is continuous the first surface 201i such that the third surface 201h intersects the first surface 201i at the end opposite to the end where the first surface 201i and the second surface 201f are continuous, and is arranged along the second direction inclined with respect to the first direction. Specifically, the third surface 201h is an inclined surface in which the ends of the third surface 201h and the first surface 201i are continuous so as to be orthogonal to the first surface 201i and which is inclined with respect to the direction in which the first surface 201i and the second surface 201f extend. The third surface 201h is disposed at a position facing the second surface 201f.

The fourth surface 201g connects the end of the second surface 201f opposite to the end where the first surface 201i and the second surface 201f are continuous and end of the third surface 201h opposite to the end where the first surface 201i and the third surface 201h are continuous, and is disposed along the third direction inclined with respect to the first direction. Specifically, the fourth surface 201g is an inclined surface that is inclined with respect to the direction in which the first surface 201i and the second surface 201f extend, the ends of the fourth surface 201g being continuous with the end of the second surface 201f and the end of the third surface 201h, respectively, so as to be orthogonal to the second surface 201f and the third surface 201h. The fourth surface 201g is disposed at a position facing the first surface 201i.

In the present embodiment, a cross-sectional area of the intake port 210 orthogonal to the airflow direction is smaller than a cross-sectional area of the exhaust port 220 orthogonal to the airflow direction. Therefore, the third surface 201h is inclined so as to approach the second surface 201f toward the intake port 210, and the fourth surface 201g is inclined so as to approach the first surface 201i toward the intake port 210. That is, the first portion 211 of the exhaust assist duct 201 on the intake port 210 side is formed in a nozzle shape in which the cross-sectional area decreases toward the intake port 210.

With such a configuration, as illustrated in FIG. 4A, the exhaust assist duct 201 is formed such that the center of the intake port 210 is shifted to the lower left in the drawing with respect to the center of the exhaust port 220 when viewed from the exhaust port 220 side. Note that the direction in which the intake port 210 is shifted with respect to the exhaust port 220 is not limited to this, and can be appropriately set. Therefore, the shape of the inner peripheral surface of the first portion 211 is not limited to such a shape, and for example, two surfaces parallel to the first direction may face each other and two surfaces inclined with respect to the first direction may also face each other, or a surface parallel to the first direction may be one surface and the other three surfaces may be inclined. Alternatively, the cross-sectional shape of the first portion 211 may be circular, and the center of the circle on the exhaust port 220 side and the center of the circle on the intake port 210 side may be eccentric. As long as the center of the intake port 210 is shifted with respect to the center of the exhaust port 220, for example, the cross-sectional shape may be a polygonal shape other than a rectangular shape, an elliptical shape, or the like.

The first holding portion 201a and the second holding portion 201b are provided at different positions with respect to the exhaust assist duct 201 so that the exhaust assist unit 200 can be held with respect to the housing 101 in a first posture and a second posture. The second posture is a posture in which the direction in which the center of the intake port 210 and the center of the exhaust port 220 are shifted with respect to the housing 101 is different from the direction in which the direction in which the center of the intake port 210 and the center of the exhaust port 220 are shifted with respect to the housing 101 in the first posture. Therefore, in the present embodiment, the first holding portion 201a and the second holding portion 201b are provided so as to protrude in directions orthogonal to each other from different positions on the outer peripheral surface of the exhaust assist duct 201.

A specific description will be given. First, as described above, the first fixing plate portion 230 and the second fixing plate portion 231 are provided in the second portion 221 on the exhaust port 220 side of the exhaust assist duct 201. The first fixing plate portion 230 and the second fixing plate portion 231 are provided so as to protrude from the outer peripheral surface of the exhaust assist duct 201 in order to fix the exhaust assist unit 200 to the housing 101 in a state of being held in the first posture or the second posture. The second portion 221 is a portion related to the airflow direction of the exhaust assist duct 201, is a rectangular portion whose outer diameter shape of the cross section orthogonal to the airflow direction is a rectangular shape, and is also a portion to which the exhaust assist fan 202 is fixed as described below. That is, the second portion 221 is a rectangular portion continuous with an end portion of the first portion 211 on the exhaust port 220 side. The first fixing plate portion 230 and the second fixing plate portion 231 are provided on different surfaces among the four surfaces constituting the outer peripheral surface of the rectangular second portion 221.

Here, the four plate portions constituting the rectangular second portion 221 are referred to as a first plate portion 221a, a second plate portion 221b, a third plate portion 221c, and a fourth plate portion 221d. The first plate portion 221a, the second plate portion 221b, the third plate portion 221c, and the fourth plate portion 221d are at positions continuous with the first surface 201i, the second surface 201f, the third surface 201h, and the fourth surface 201g of the first portion 211, respectively. In the illustrated example, the first fixing plate portion 230 is formed to protrude from the first plate portion 221a continuous with the first surface 201i, and the second fixing plate portion 231 is formed to protrude from the fourth plate portion 221d continuous with the fourth surface 201g.

The first holding portion 201a is provided on the first fixing plate portion 230, and the second holding portion 201b is provided on the second fixing plate portion 231. Specifically, in FIG. 4A, the first holding portion 201a is provided so as to protrude above the first fixing plate portion 230, and the second holding portion 201b is provided so as to protrude to the right of the second fixing plate portion 231. In the present embodiment, as described above, the first holding portion 201a and the second holding portion 201b are provided so as to protrude in directions orthogonal to each other from different positions of the outer peripheral surface of the exhaust assist duct 201.

As illustrated in FIGS. 3B and 4B, the exhaust assist fan 202 is fixed to the exhaust port 220 of the exhaust assist duct 201. That is, the exhaust assist fan 202 is disposed on the side of the exhaust port 220 where the airflow is exhausted, and is connected to the exhaust port 220. The exhaust port 220 is an opening formed in the second portion 221 formed in a rectangular shape, and also has a rectangular shape. The exhaust assist fan 202 having a rectangular outer shape is fixed to the exhaust port 220.

The position where the exhaust assist fan 202 is disposed is not limited thereto, and may be, for example, in the middle of the exhaust assist duct 201. In the present embodiment, the exhaust assist fan 202 is installed in the exhaust port 220 which is a portion having a large cross-sectional area, hence the fan 202 is easily installed. The cross-sectional area of the exhaust assist fan 202 is substantially equal to the cross-sectional area of the exhaust port 220. The intake port 210 is located on the opposite side of the exhaust assist fan 202 of the exhaust assist duct 201, and is formed at a position of about 60 mm from the mounting surface of the exhaust assist fan 202.

Figure 6A:
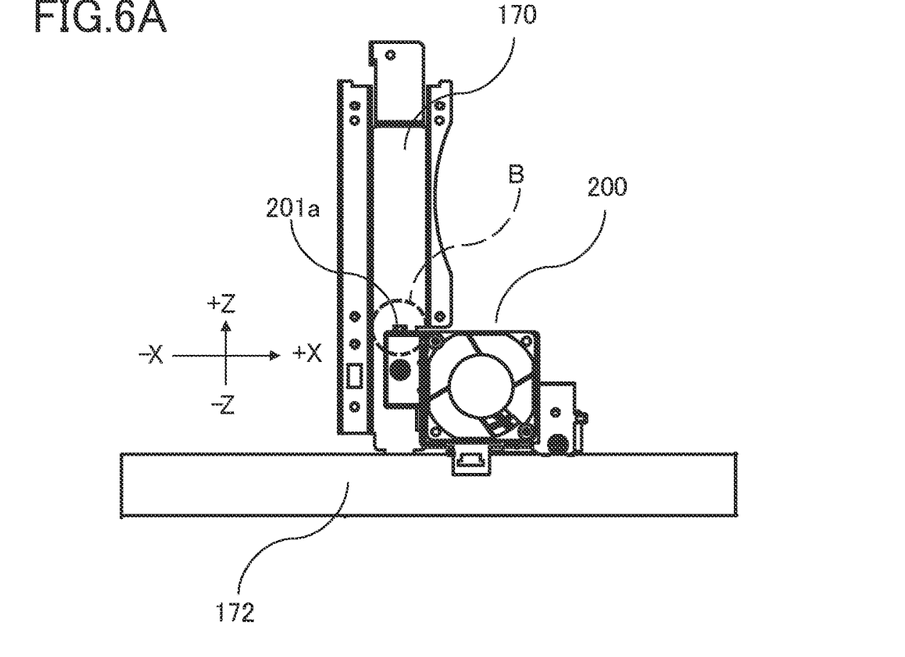
FIG. 6A is a view illustrating a state in which the exhaust assist unit according to the first embodiment is assembled to the housing in a first posture.
Figure 6B:
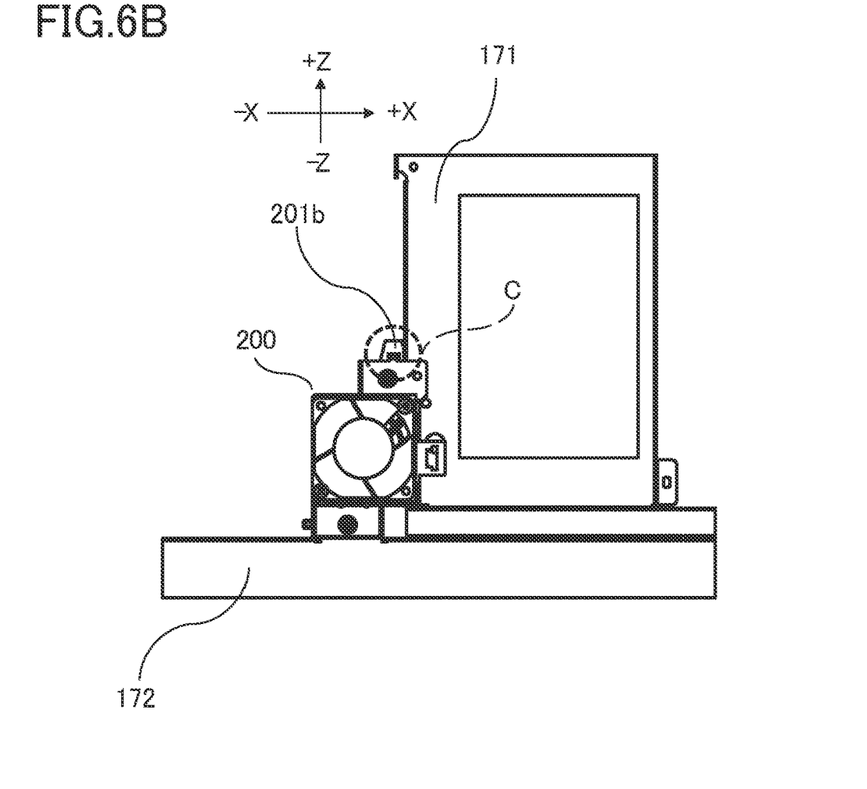
FIG. 6B is a view illustrating a state in which the exhaust assist unit according to the first embodiment is assembled to the housing in a second posture.
Figure 7A:
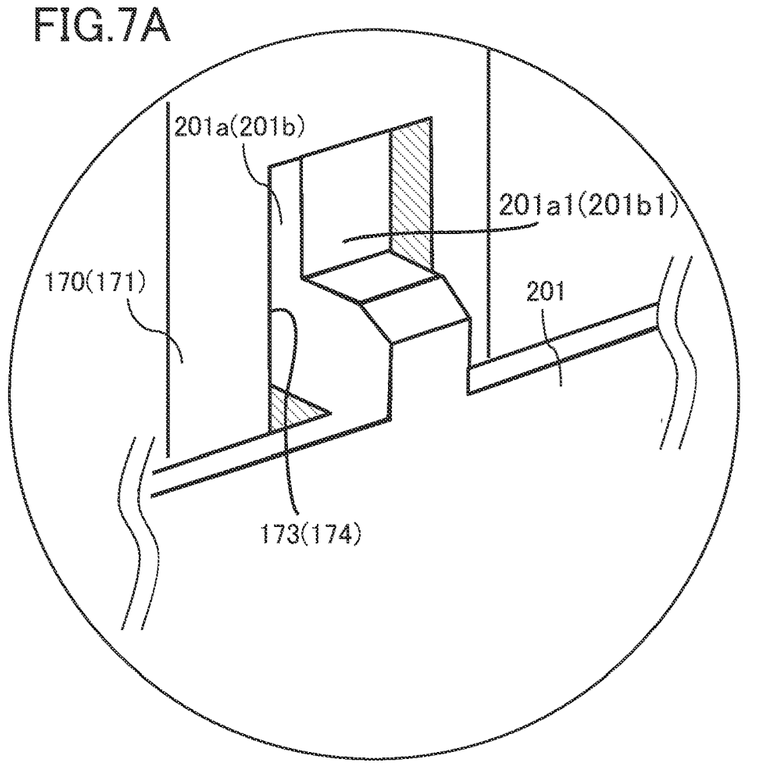
FIG. 7A is an enlarged perspective view illustrating a holding portion that holds the exhaust assist unit to the housing.
Figure 7B:
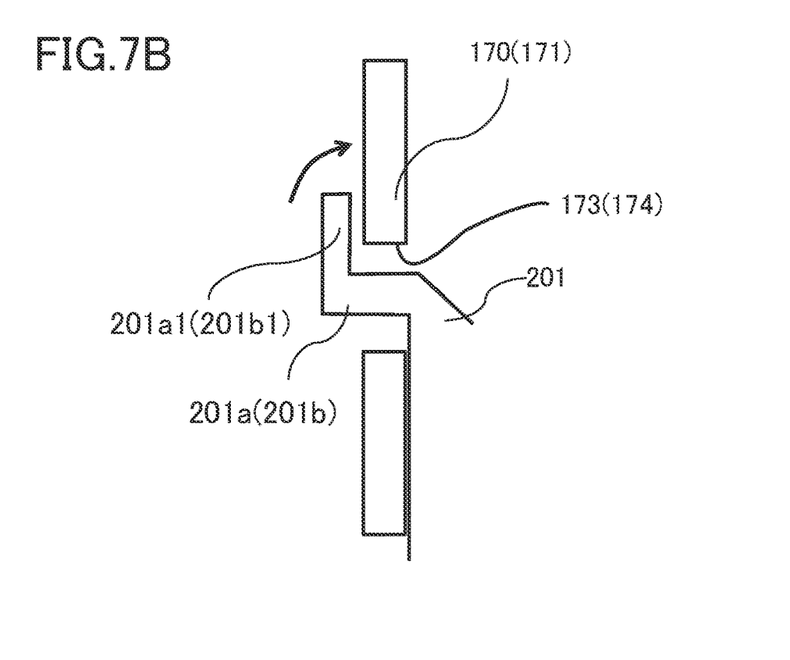
FIG. 7B is an enlarged cross-sectional view illustrating the holding portion that holds the exhaust assist unit to the housing.

When the exhaust assist unit 200 is assembled to the housing 101, first, the exhaust assist unit 200 is temporarily held on the support column 170 or the support plate 171 of the housing 101 by the first holding portion 201a and the second holding portion 201b in the first posture or the second posture. Specifically, as illustrated in FIGS. 7A and 7B, an engagement hole 173 or 174 is formed in each of the support column 170 and the support plate 171. FIGS. 7A and 7B are an enlarged perspective view and a cross-sectional view illustrating a portion B and a portion C in FIGS. 6A and 6B described below. The first holding portion 201a and the second holding portion 201b have hook portions 201a1 and 201b1 that can enter and engage with the engagement holes 173 or 174. By hooking the hook portion 201a1 or 201b1 on a part of the support column 170 or the support plate 171 via the engagement hole 173 or 174, it is possible to temporarily hold the exhaust assist unit 200 on the support column 170 or the support plate 171.

As described above, the first fixing plate portion 230 and the second fixing plate portion 231 are provided vicinity of the first holding portion 201a and the second holding portion 201b. That is, the first holding portion 201a and the second holding portion 201b are provided on the first fixing plate portion 230 and the second fixing plate portion 231, respectively. As illustrated in FIGS. 3B and 4A, the first fixing plate portion 230 and the second fixing plate portion 231 are formed with fastening holes 201c, 201d, and 201e that can be fastened to the support column 170 or the support plate 171 with screws or the like. Specifically, two fastening holes 201c and 201d are formed in the second fixing plate portion 231, and a fastening hole 201e that is an elongated hole is formed in the first fixing plate portion 230.

The fastening holes 201c and 201d have hole diameters (hereinafter, referred to as location hole) equivalent to diameters of the screws to be used. The fastening hole 201e is a long hole that is long in a direction orthogonal to the direction in which the fastening holes 201c and 201d are arranged, and the position of the exhaust assist unit 200 can be finely adjusted in a state of being temporarily fixed with a screw. Accordingly, the exhaust assist unit 200 can be disposed with high accuracy. In addition, since there are two fastening holes 201c and 201d as location holes, it is possible to fix the exhaust assist unit 200 to the support column using any fastening hole in accordance with the posture of the exhaust assist unit 200.

As described above, in the present embodiment, since the first fixing plate portion 230 and the second fixing plate portion 231 are provided, the exhaust assist unit 200 can be fixed to the housing 101 by being fastened to the housing 101 at two positions. The first fixing plate portion 230 and the second fixing plate portion 231 are provided on surfaces parallel to the mounting surface of the exhaust assist fan 202 to the exhaust assist duct 201, respectively. As a result, a vibration caused by the fan and a chattering sound caused by the vibration are reduced by coming into surface contact with the fastening target.

In addition, the exhaust assist unit 200 has a shape to which a relay connector for connecting a bundled wire connector of the exhaust assist fan 202 can be connected. In the case of the present embodiment, as illustrated in FIGS. 3A and 4B, the exhaust assist duct 201 has a wall portion 201j that is longer than the length (width) of the exhaust assist fan 202 in the airflow direction and extends from at least a part of the periphery of the exhaust port 220 toward the exhaust direction of the airflow. The wall portion 201j is disposed so as to cover two directions around the exhaust assist fan 202, and is a wall having a width larger than the width of the exhaust assist fan 202. The relay connector is provided in the vicinity of the wall portion 201j. This prevents a bundle of wires attached to the exhaust assist fan 202 and a bundle of wires crossing the periphery from being caught in the exhaust assist fan 202.

Assembly of Exhaust Assist Unit to Housing

A specific example in which the exhaust assist unit 200 described above is assembled to the housing 101 will be described. Inside the housing 101, there are a plurality of heat sources such as the development driving unit 112a and the intermediate transfer belt driving unit 106a. Therefore, in the present embodiment, the plurality of exhaust assist units 200 are disposed inside the housing 101 corresponding to the plurality of heat sources. At least one of the plurality of exhaust assist units 200 is held in the housing 101 in the first posture, and at least one of the plurality of remaining exhaust assist units 200 is held in the housing 101 in the second posture.

First, with reference to FIGS. 5 to 6B, a description will be given of a case where two exhaust assist units 200 are assembled to two places of the first housing 101a while changing their posture. FIG. 5 illustrates a state in which the exhaust assist unit 200 is assembled to the support columns 170 and 172 and the support plate 171 of the first housing 101a supporting the two electric is units 17a and 17b on the back surface side of the photosensitive drum 105 of the station 120 while changing the posture.

The exhaust assist unit 200 on the left side of FIG. 5 assists the exhaust of the heat generated in the development driving unit 112a, and the exhaust assist unit 200 on the right side assists the exhaust of the heat generated in the intermediate transfer belt driving unit 106a. In the illustrated example, the exhaust assist unit 200 on the left side of FIG. 5 is fixed to the support column 170 in the first posture as illustrated in FIG. 6A. As illustrated in FIG. 6B, the exhaust assist unit 200 on the right side of FIG. 5 is fixed to the support plate 171 in the second posture.

Figure 8:
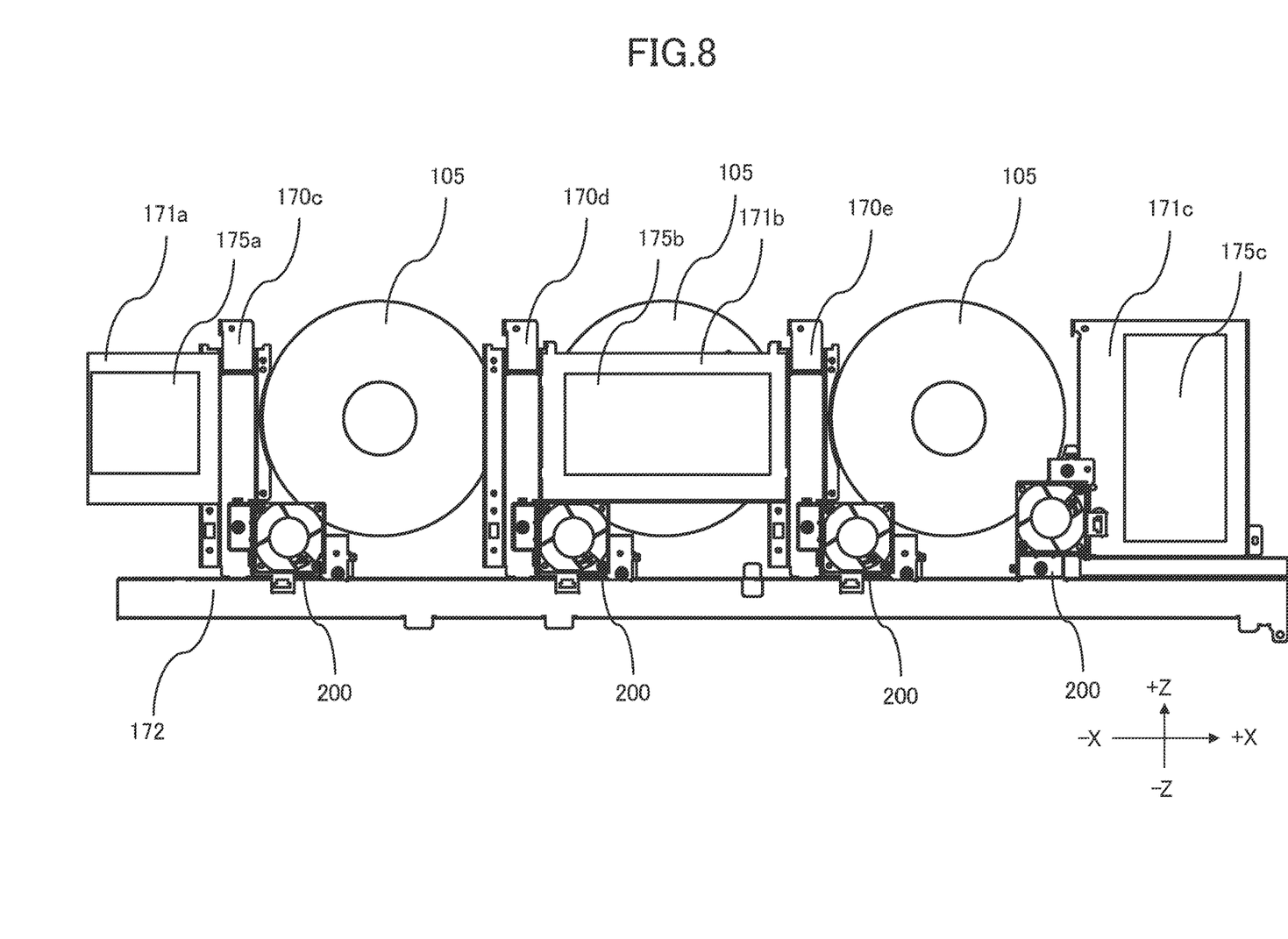
FIG. 8 is a schematic configuration diagram of a state in which the exhaust assist unit according to the first embodiment is assembled to a plurality of places of the housing.

FIG. 8 illustrates an example of a configuration in which a plurality of exhaust assist units 200 are assembled at a plurality of places. As illustrated in FIG. 8, the exhaust assist unit 200 is used at a total of four locations connected to the support column 172 and the support column 170c (1), the support column 172 and the support column 170d (2), the support column 172 and the support column 170e (3), and the support column 172 and the support plate 171c (4). The support column 172 is a common support column provided across the stations. In (1) to (3), the exhaust assist unit 200 is arranged in the first posture, and in (4), the exhaust assist unit 200 is arranged in the second posture. In (1) to (3), the heat generated from the development driving unit 112a is mainly inhaled and the heat is exhausted to the main body heat exhaust fan 180 side. In (4), the heat of the intermediate transfer belt driving unit 106a is mainly inhaled and the heat is exhausted to the main body heat exhaust fan 180 side. The power supply to the exhaust assist unit 200 of (1) and (2) is performed from the substrate 175a supported by the support plate 171a, and the power supply to the exhaust assist unit 200 of (3) and (4) is performed from the substrate 175b supported by the support plate 171b. The substrate 175c is supported by the support plate 171c.

As described above, in the case of the configuration of the present embodiment, the center positions of the intake port 210 and the exhaust port 220 of the exhaust assist duct 201 are shifted, and the exhaust assist unit 200 can be held with respect to the housing in postures in which the directions in which the center positions of the intake port 210 and the exhaust port 220 are shifted are different. Therefore, it is possible to arrange the exhaust assist unit 200 while changing the posture of the exhaust assist unit 200 according to the shape of the periphery of the position where the exhaust assist unit is arranged. Therefore, the exhaust assist unit 200 of the present embodiment can be disposed in a space-saving manner, and can efficiently intake air from the vicinity of the heat source.

Note that the posture in which the exhaust assist unit 200 is disposed is not limited to the above-described two postures. In the case of the present embodiment, it is possible to set up to four postures in which the directions in which the center positions of the intake port 210 and the exhaust port 220 are shifted are different.

Second Embodiment

A second embodiment will be described with reference to FIG. 9. In the present embodiment, more exhaust assist units 200 are arranged than in the case illustrated in FIG. 8 of the first embodiment. Since other configurations and operations are the same as those of the first embodiment described above, the same configurations are denoted by the same reference numerals, description and illustration thereof are omitted or simplified, and hereinafter, differences from the first embodiment will be mainly described.

Figure 9:
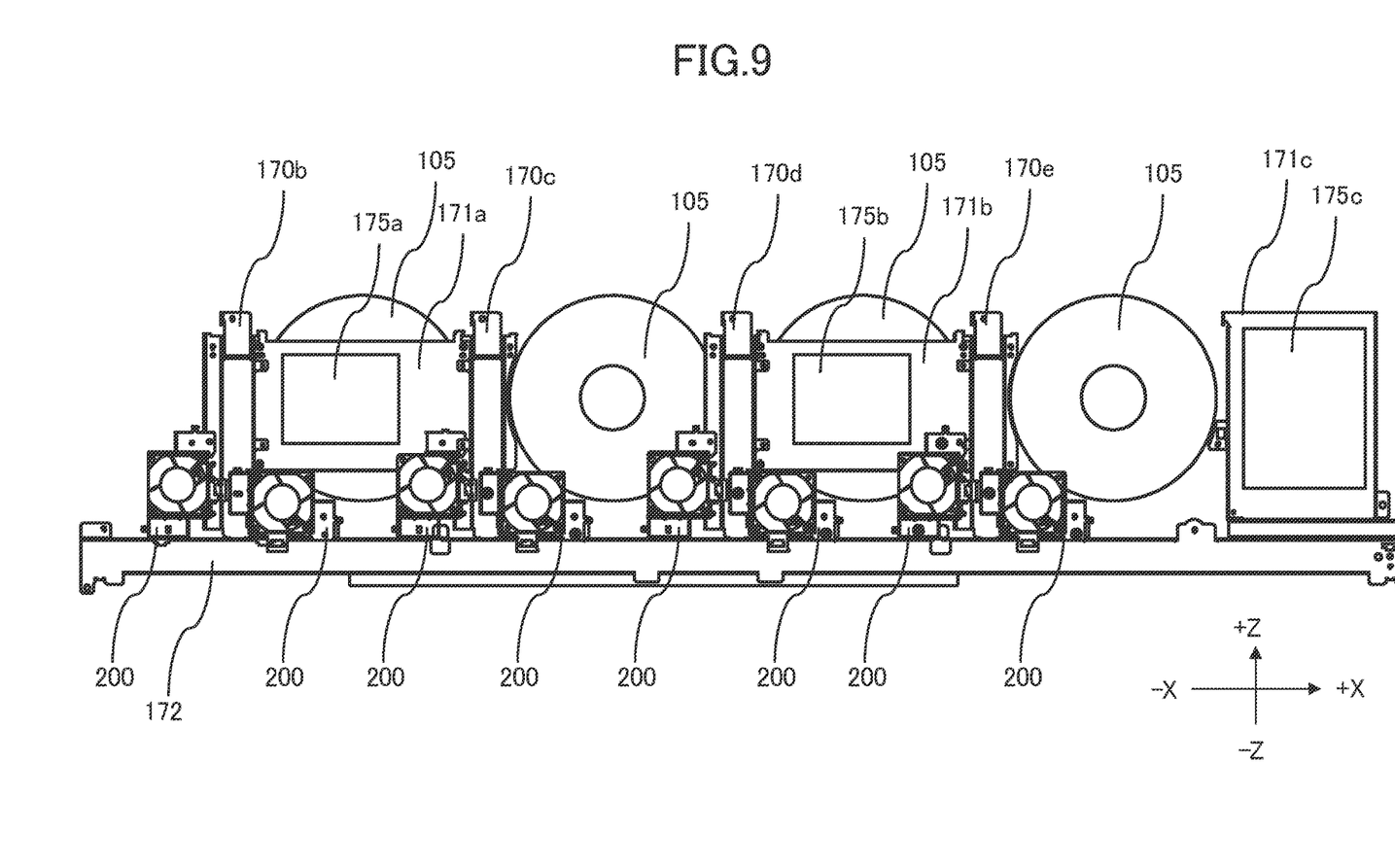
FIG. 9 is a schematic configuration diagram of a state in which an exhaust assist unit according to a second embodiment is assembled to a plurality of places of the housing.

As illustrated in FIG. 9, in the present embodiment, eight sets of exhaust assist units 200 are used. In a case where the thermal influence of the development driving unit 112a on the image forming unit 102 is large, and there is a concern that the image quality may be deteriorated, the present embodiment is preferable.

A total of 8 pairs of exhaust assist units 200 are used, which are connected to the support column 172 and the support column 170b in two pairs (5) with the support column 170b interposed therebetween, the support column 172 and the support column 170c in two pairs (6) with the support column 170c interposed therebetween, the support column 172 and the support column 170d in two pairs (7) with the support column 170d interposed therebetween, and the support column 172 and the support column 170e in two pairs (8) with the support column 170e interposed therebetween.

Of the exhaust assist units 200 connected to the same column, the exhaust assist units 200 of +X side in the drawing is fastened in a first posture and the exhaust assist units 200 of −X side in the drawing is fastened in a second posture. In (5), the heat of the development driving unit 112a of the station 123 of Bk (black) is inhaled and exhausted, in (6), the heat of the development driving unit 112a of the station 122 of C (cyan) is inhaled and exhausted, in (7), the heat of the development driving unit 112a of the station 121 of M (magenta) is inhaled and exhausted, and in (8), the heat of the development driving unit 112a of the station 120 of Y (yellow) is inhaled and exhausted, respectively. The power supply to the exhaust assist unit 200 of (5) and (6) is performed from the substrate 175a, and the power supply to the exhaust assist unit 200 of (7) and (8) is performed from the substrate 175b.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-056437, filed Mar. 30, 2022, which is hereby incorporated by reference herein in its entirety.

What is claimed is:

1. A duct unit configured to be disposed inside a housing of an image forming apparatus, the duct unit comprising:
an airflow generation unit configured to generate an airflow;
a duct through which the airflow generated by the airflow generation unit flows; and
a first holding portion and a second holding portion for holding the duct unit in the housing,
wherein the duct has a shape in which an intake port and an exhaust port are located on the same straight line with respect to an airflow direction in which the airflow flows, and a center of the intake port and a center of the exhaust port, in a cross section orthogonal to the airflow direction, are shifted from each other,
the first holding portion and the second holding portion are provided at different positions with respect to the duct so as to be able to hold the duct unit with respect to the housing in a first posture and a second posture, in which in the second posture a direction in which the center of the intake port and the center of the exhaust port are shifted with respect to the housing is a direction different from a direction in which the center of the intake port and the center of the exhaust port are shifted with respect to the housing in the first posture, and
an inner peripheral surface of a part of the duct in the airflow direction includes:
a first surface and a second surface that are arranged in parallel with a first direction along the airflow direction and are continuously arranged so as to intersect each other;
a third surface that is continuous with the first surface such that the third surface intersects the first surface at an end opposite to an end where the second surface and the first surface are continuous, and arranged along a second direction inclined with respect to the first direction; and
a fourth surface that connects an end of the second surface opposite to an end where the first surface and the second surface are continuous and an end of the third surface opposite to an end where the first surface and the third surface are continuous, and is disposed along a third direction inclined with respect to the first direction.

2. The duct unit according to claim 1, wherein
the first holding portion and the second holding portion are provided so as to respectively protrude in directions orthogonal to each other from different positions on an outer peripheral surface of the duct.

3. The duct unit according to claim 1, further comprising a first fixing plate portion and a second fixing plate portion provided so as to protrude from an outer peripheral surface of the duct in order to fix the duct unit to the housing in a state where the duct unit is held in the first posture and the second posture,
wherein the first holding portion is provided on the first fixing plate portion, and
the second holding portion is provided on the second fixing plate portion.

4. The duct unit according to claim 1, wherein
the duct includes a rectangular portion in a part with respect to the airflow direction in which an outer diameter shape of a cross section orthogonal to the airflow direction is a rectangular shape, and
the first holding portion and the second holding portion are provided on different surfaces among four surfaces constituting an outer peripheral surface of the rectangular portion.

5. The duct unit according to claim 1, wherein
a cross-sectional area of the intake port orthogonal to the airflow direction is smaller than a cross-sectional area of the exhaust port orthogonal to the airflow direction.

6. The duct unit according to claim 5, wherein
the airflow generation unit is an axial fan fixed to the exhaust port of the duct.

7. The duct unit according to claim 6, wherein
the duct has a wall portion that is longer than a length of the axial fan in the airflow direction and extends from at least a part of a periphery of the exhaust port toward an exhaust direction of the airflow.

8. An image forming apparatus comprising:
a housing having a plurality of heat sources therein; and
a plurality of duct units disposed inside the housing so as to correspond to the plurality of heat sources,
wherein each of the plurality of duct units includes:
an airflow generation unit configured to generate an airflow;
a duct through which the airflow generated by the airflow generation unit flows; and
a first holding portion and a second holding portion for holding the duct unit in the housing,
the duct has a shape in which an intake port and an exhaust port are located on the same straight line with respect to an airflow direction in which the airflow flows, and a center of the intake port and a center of the exhaust port in a cross section orthogonal to the airflow direction are shifted from each other,
the first holding portion and the second holding portion are provided at different positions with respect to the duct so as to be able to hold the duct unit with respect to the housing in a first posture and a second posture, in which in the second posture a direction in which the center of the intake port and the center of the exhaust port are shifted with respect to the housing is a direction different from a direction in which the center of the intake port and the center of the exhaust port are shifted with respect to the housing in the first posture,
at least one of the plurality of duct units is held in the housing in the first posture, and
at least one of the plurality of remaining duct units is held in the housing in the second posture.

9. The image forming apparatus according to claim 8, wherein
the first holding portion and the second holding portion are provided so as to respectively protrude in directions orthogonal to each other from different positions on an outer peripheral surface of the duct.

10. The image forming apparatus according to claim 8, further comprising
a first fixing plate portion and a second fixing plate portion provided so as to protrude from an outer peripheral surface of the duct in order to fix the duct unit to the housing in a state where the duct unit is held in the first posture and the second posture,
wherein the first holding portion is provided on the first fixing plate portion, and
the second holding portion is provided on the second fixing plate portion.

11. The image forming apparatus according to claim 8, wherein
the duct includes a rectangular portion in a part with respect to the airflow direction in which an outer diameter shape of a cross section orthogonal to the airflow direction is a rectangular shape, and
the first holding portion and the second holding portion are provided on different surfaces among four surfaces constituting an outer peripheral surface of the rectangular portion.

12. The image forming apparatus according to claim 8, wherein
an inner peripheral surface of a part of the duct in the airflow direction includes:
a first surface and a second surface that are arranged in parallel with a first direction along the airflow direction and are continuously arranged so as to intersect each other;
a third surface that is continuous with the first surface such that the third surface intersects the first surface at an end opposite to an end where the second surface and the first surface are continuous, and arranged along a second direction inclined with respect to the first direction; and
a fourth surface that connects an end of the second surface opposite to an end where the first surface and the second surface are continuous and an end of the third surface opposite to an end where the first surface and the third surface are continuous, and is disposed along a third direction inclined with respect to the first direction.

13. The image forming apparatus according to claim 8, wherein
a cross-sectional area of the intake port orthogonal to the airflow direction is smaller than a cross-sectional area of the exhaust port orthogonal to the airflow direction.

14. The image forming apparatus according to claim 13, wherein
the airflow generation unit is an axial fan fixed to the exhaust port of the duct.

15. The image forming apparatus according to claim 14, wherein
the duct has a wall portion that is longer than a length of the axial fan in the airflow direction and extends from at least a part of a periphery of the exhaust port toward an exhaust direction of the airflow.

* * * * *